United States Patent
Nanao

(10) Patent No.: US 9,935,256 B2
(45) Date of Patent: Apr. 3, 2018

(54) PIEZOELECTRIC COMPOSITION, PIEZOELECTRIC ELEMENT AND SPUTTERING TARGET

(71) Applicant: TDK CORPORATION, Tokyo (JP)

(72) Inventor: Masaru Nanao, Tokyo (JP)

(73) Assignee: TDK CORPORATION, Tokyo (JP)

(*) Notice: Subject to any disclaimer, the term of this patent is extended or adjusted under 35 U.S.C. 154(b) by 395 days.

(21) Appl. No.: 14/859,977

(22) Filed: Sep. 21, 2015

(65) Prior Publication Data
US 2016/0093793 A1    Mar. 31, 2016

(30) Foreign Application Priority Data
Sep. 25, 2014    (JP) ................. 2014-194790

(51) Int. Cl.
*H01L 41/187*    (2006.01)
*H01L 41/18*    (2006.01)
(Continued)

(52) U.S. Cl.
CPC ............ *H01L 41/18* (2013.01); *C01G 23/005* (2013.01); *C01G 25/00* (2013.01); *C01G 33/006* (2013.01);
(Continued)

(58) Field of Classification Search
CPC ....... H01L 41/18; C01G 23/005; C01G 25/00; C01G 33/006; C01G 35/006;
(Continued)

(56) References Cited

U.S. PATENT DOCUMENTS 8,592,041 B2 * 11/2013 Adachi ................ C04B 35/20
428/432
2007/0152183 A1    7/2007 Furukawa et al.
(Continued)

FOREIGN PATENT DOCUMENTS

CN    103224390 A    7/2013
JP    S49125900 A    12/1974
(Continued)

*Primary Examiner* — Thomas Dougherty
(74) *Attorney, Agent, or Firm* — Oliff PLC

(57) ABSTRACT

The present invention aims to provide a piezoelectric composition containing a composition represented by formula (5) as the main component, wherein the composition represented by formula (5) contains a first perovskite-type oxide represented by formula (1), a second perovskite-type oxide represented by formula (2), a tungsten bronze-type oxide represented by formula (3) and a third perovskite-type oxide represented by formula (4), $(K_{1-x-y}Na_xLi_y)_q(Nb_{1-z}Ta_z)O_3$ (1), $SrZrO_3$ (2), $Ba(Nb_{1-w}Ta_w)_2O_6$ (3), $(Bi_{0.5}Na_{0.5})TiO_3$ and/or $(Bi_{0.5}K_{0.5})TiO_3$ (4), (1−m−n−p)A+mB+nC+pD (5); in formula (1), $0.20 \le x \le 0.80$, $0.02 \le y \le 0.10$, $0.01 \le z \le 0.30$ and $0.800 \le q \le 1.050$; in formula (3), $0.01 \le w \le 0.30$; and in formula (5), A represents the composite oxide represented by formula (1), B represents the composite oxide represented by formula (2), C represents the composite oxide represented by formula (3), D represents the composite oxide represented by formula (4), and $0.04 \le m \le 0.07$, $0 \le n \le 0.010$ and $0.001 \le p \le 0.020$.

6 Claims, 1 Drawing Sheet

(51) Int. Cl.
  *C04B 35/495* (2006.01)
  *C04B 35/626* (2006.01)
  *C04B 35/638* (2006.01)
  *C23C 14/34* (2006.01)
  *C04B 35/475* (2006.01)
  *H01L 41/047* (2006.01)
  *C01G 23/00* (2006.01)
  *C01G 25/00* (2006.01)
  *C01G 33/00* (2006.01)
  *C01G 35/00* (2006.01)
  *C23C 14/08* (2006.01)

(52) U.S. Cl.
  CPC .......... *C01G 35/006* (2013.01); *C04B 35/475* (2013.01); *C04B 35/495* (2013.01); *C04B 35/6261* (2013.01); *C04B 35/62625* (2013.01); *C04B 35/62655* (2013.01); *C04B 35/638* (2013.01); *C23C 14/088* (2013.01); *C23C 14/3407* (2013.01); *C23C 14/3414* (2013.01); *H01L 41/047* (2013.01); *H01L 41/1873* (2013.01); *C01P 2002/30* (2013.01); *C01P 2002/34* (2013.01); *C01P 2006/40* (2013.01); *C04B 2235/3201* (2013.01); *C04B 2235/3203* (2013.01); *C04B 2235/3213* (2013.01); *C04B 2235/3215* (2013.01); *C04B 2235/3234* (2013.01); *C04B 2235/3248* (2013.01); *C04B 2235/3251* (2013.01); *C04B 2235/3255* (2013.01); *C04B 2235/3262* (2013.01); *C04B 2235/3281* (2013.01); *C04B 2235/3298* (2013.01); *C04B 2235/6567* (2013.01); *C04B 2235/768* (2013.01); *C04B 2235/79* (2013.01); *C04B 2235/80* (2013.01)

(58) Field of Classification Search
  CPC . C04B 35/475; C04B 35/495; C04B 35/6261; C04B 35/62625; C04B 35/62655; C04B 35/638; C23C 14/088; C23C 14/3407
  USPC ....... 310/358; 252/62.9 PZ, 62.9 R; 501/134
  See application file for complete search history.

(56) References Cited

U.S. PATENT DOCUMENTS

2010/0102679 A1  4/2010  Kawada
2013/0193367 A1  8/2013  Masai et al.

FOREIGN PATENT DOCUMENTS

| JP | S576713 B2 | 2/1982 |
| JP | 4513948 B2 | 7/2010 |
| WO | 2008152851 A1 | 12/2008 |

* cited by examiner

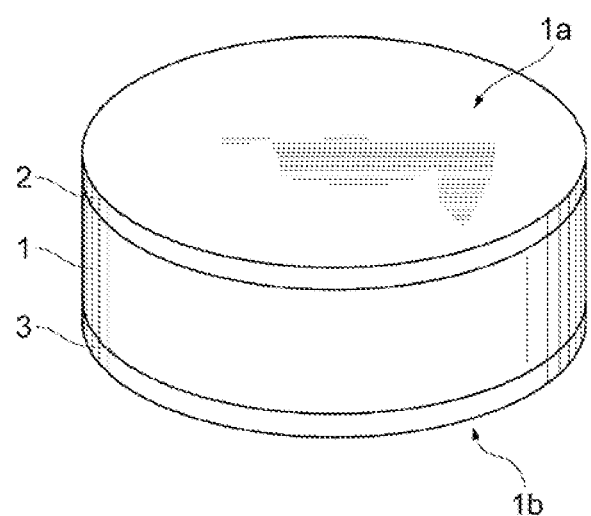

PIEZOELECTRIC COMPOSITION, PIEZOELECTRIC ELEMENT AND SPUTTERING TARGET

The present invention relates to a piezoelectric composition and a piezoelectric element or a sputtering target containing the piezoelectric composition.

BACKGROUND

An actuator using a piezoelectric composition is an element taking advantage of a piezoelectric phenomenon that a mechanical strain and a stress are generated when an electric field is applied. Such an actuator is capable of providing a minute displacement in a highly precise manner and also possesses characteristics such as a high initiation stress. For example, such an actuator can be used for the positioning in a precision machine tool or an optical device. As the piezoelectric composition used in this actuator, the lead zirconate titanate (Pb(Zr, Ti)O$_3$) can be listed here.

However, such a lead zirconate titanate based piezoelectric composition contains a lot of Pb, so a problem arises recently that the Pb dissolved in the acid rain will have a bad influence on global environment. Thus, it is desired to develop a non-lead based piezoelectric composition free of Pb instead of lead zirconate titanate based piezoelectric composition.

For instance, in Patent Documents 1 and 2, a non-lead based piezoelectric composition composed of lithium potassium sodium niobate has been disclosed to have a curie temperature as high as 350° C. or higher and also have an excellent electro-mechanical coupling factor k$_r$.

Further, in Patent Documents 3 and 4, a lithium potassium sodium niobate based piezoelectric composition and a piezoelectric composition containing a tungsten bronze-type oxide and a perovskite-type oxide have been disclosed as the non-lead based piezoelectric composition exhibiting a relatively large displacement amount.

PATENT DOCUMENT

Patent Document 1: JP-A-S49-125900
Patent Document 2: JP-B-S57-6713
Patent Document 3: WO2008/152851
Patent Document 4: JP-4513948

SUMMARY

In the application of an actuator or a sensor into electronic equipments for people's livelihood or industry, the variation rate of piezoelectric properties against temperature is required to be low especially in a temperature range of −40° C. to 85° C.

However, in any one of Patent Documents 1 to 4, although excellent piezoelectric properties are provided in non-lead based piezoelectric composition, the variation rate of piezoelectric properties against temperature has not been studied yet.

The present invention has been completed in view of the situations mentioned above and aims to provide an environment-friendly piezoelectric composition with excellent piezoelectric properties and a low variation rate of piezoelectric properties against temperature in a temperature range of −40° C. to 85° C. The present invention also aims to provide a piezoelectric element or a sputtering target containing the mentioned piezoelectric composition.

In order to solve the technical problem mentioned above, the present inventors have tested the environment-friendly piezoelectric composition with excellent piezoelectric properties and a low variation rate of piezoelectric properties against temperature in a temperature range of −40° C. to 85° C., and have discovered a piezoelectric composition having composition ranges different from the conventional ones.

The piezoelectric composition is one having a composition represented by formula (5) as the main component, wherein the composition represented by formula (5) contains a first perovskite-type oxide represented by the following formula (1), a second perovskite-type oxide represented by the following formula (2), a tungsten bronze-type oxide represented by the following formula (3) and a third perovskite-type oxide represented by the following formula (4).

$$(K_{1-x-y}Na_xLi_y)_q(Nb_{1-z}Ta_z)O_3 \quad (1)$$

(Wherein, in this formula, $0.20 \leq x \leq 0.80$, $0.02 \leq y \leq 0.10$, $0.01 \leq z \leq 0.30$ and $0.800 \leq q \leq 0.050$.)

$$SrZrO_3 \quad (2)$$

$$Ba(Nb_{1-w}Ta_w)_2O_6 \quad (3)$$

(Wherein, in this formula, $0.01 \leq w \leq 0.30$.)

$$(Bi_{0.5}Na_{0.5})TiO_3 \text{ and/or } (Bi_{0.5}K_{0.5})TiO_3 \quad (4)$$

$$(1-m-n-p)A+mB+nC+pD \quad (5)$$

(Wherein, in this formula, A represents the composite oxide represented by the formula (1), B represents the composite oxide represented by the formula (2), C represents the composite oxide represented by the formula (3), D represents the composite oxide represented by the formula (4), and $0.04 \leq m \leq 0.07$, $0 < n \leq 0.010$ and $0.001 \leq p \leq 0.020$.)

With the composition ranges mentioned above, an environment-friendly piezoelectric composition with excellent piezoelectric properties and a low variation rate of piezoelectric properties against temperature in a temperature range of −40° C. to 85° C. will be provided.

Further, it is preferable that at least one of manganese (Mn) and copper (Cu) is contained as the minor component and the piezoelectric composition represented by the following formula (6) will be provided when the minor component is calculated in terms of manganese oxide (MnO) or copper oxide (CuO) respectively. In this respect, the resistivity of the piezoelectric composition can be increased and a polarization treatment can be performed with applying an electric field having a higher intensity so that better piezoelectric properties can be provided.

$$(1-s)E+sF \quad (6)$$

(Wherein, in the formula, E represents the composite oxide represented by the formula (5) which is the main component, F represents the minor component, and $0 < s \leq 0.015$.)

At the boundaries among crystal grains of the composite oxides which are the main components, there is a microstructure in which at least one element of manganese (Mn) and copper (Cu) segregates. Thereby the resistivity of the piezoelectric composition can be increased so as to provide a stable piezoelectric composition with few deviations.

In addition, in the present invention, a piezoelectric element can be provided which contains the piezoelectric composition mentioned above and has excellent piezoelectric properties. Such a piezoelectric element also has a low variation rate of piezoelectric properties against temperature at a temperature range of −40° C. to 85° C. because of the environment-friendly piezoelectric composition. Further, a piezoelectric element can be provided by using a sputtering target made of the piezoelectric composition mentioned above, wherein such a piezoelectric element has excellent piezoelectric properties and has a low variation rate of piezoelectric properties against temperature at a temperature range of −40° C. to 85° C. because of the environment-friendly piezoelectric composition.

According to the present invention, an environment-friendly piezoelectric composition with excellent piezoelectric properties and a low variation rate of piezoelectric properties against temperature in a temperature range of −40° C. to 85° C. can be provided as well as a piezoelectric element or a sputtering target containing the mentioned piezoelectric composition.

BRIEF DESCRIPTION OF THE DRAWINGS

FIG. 1 is a structure drawing showing the piezoelectric element which utilizes the piezoelectric composition according to the embodiment of the present invention.

DETAILED DESCRIPTION OF EMBODIMENTS

Hereinafter, the preferable embodiments of the present invention will be described in detail with reference to the drawing if needed.

The piezoelectric composition of the present embodiment is one with the composition represented by formula (5) as the main component. The composition represented by formula (5) contains a first perovskite-type oxide represented by the following formula (1), a second perovskite-type oxide represented by the following formula (2), a tungsten bronze-type oxide represented by the following formula (3) and a third perovskite-type oxide represented by the following formula (4). In addition, in the present embodiment, the main component refers to a component contained in an amount of 98 mol % or more based on the whole piezoelectric composition.

$$(K_{1-x-y}Na_xLi_y)_q(Nb_{1-z}Ta_z)O_3 \quad (1)$$

(Wherein, in this formula, $0.20 \leq x \leq 0.80$, $0.02 \leq y \leq 0.10$, $0.01 \leq z \leq 0.30$ and $0.800 \leq q \leq 1.050$.)

$$SrZrO_3 \quad (2)$$

$$Ba(Nb_{1-w}Ta_w)_2O_6 \quad (3)$$

(Wherein, in this formula, $0.01 \leq w \leq 0.30$.)

$$(Bi_{0.5}Na_{0.5})TiO_3 \text{ and/or } (Bi_{0.5}K_{0.5})TiO_3 \quad (4)$$

$$(1-m-n-p)A+mB+nC+pD \quad (5)$$

(Wherein, in this formula, A represents the composite oxide represented by the formula (1), B represents the composite oxide represented by the formula (2), C represents the composite oxide represented by the formula (3). D represents the composite oxide represented by the formula (4), and $0.04 \leq m \leq 0.07$, $0 \leq n \leq 0.010$ and $0.001 \leq p \leq 0.020$.)

In formula (1), x representing the amount of sodium (Na) is 0.20 or more and 0.80 or less. It is preferable that x ranges from 0.40 to 0.70 to provide a piezoelectric composition with even better piezoelectric properties. If x exceeds 0.80, the piezoelectric properties deteriorate. When x is less than 0.20, the amount of potassium (K) will be relatively high, making the piezoelectric composition hard to be fired due to violent volatilization of potassium (K) during the firing process.

In formula (1), y representing the amount of lithium (Li) is 0.02 or more and 0.10 or less. It is preferable that y ranges from 0.03 to 0.08 to provide a piezoelectric composition with even better piezoelectric properties. If y is over 0.10, the piezoelectric properties will deteriorate because the resistivity decrease and the polarization treatment cannot be done under an electric field with a sufficient intensity. On the other hand, when y is less than 0.02, high piezoelectric properties cannot be achieved.

In formulae (1) and (3), z and w both representing the amount of tantalum (Ta) are 0.01 or more and 0.30 or less. The z and w are preferably 0.04 or more and 0.25 or less and more preferably 0.05 or more and 0.15 or less to provide a piezoelectric composition with even better piezoelectric properties. If z and w are higher than 0.30, the curie temperature will decrease and the piezoelectric properties will deteriorate. When z and w are 0, high piezoelectric properties cannot be achieved.

In formula (1), q representing the ratio of A site to B site in the first perovskite-type oxide is 0.800 or more and 1.050 or less. The q is preferably 0.850 or more and 1.030 or less and more preferably 0.900 or more and 1.000 or less to provide a piezoelectric composition with even better piezoelectric properties. If q is less than 0.800 or q is higher than 1.050, sinterability is bad and high piezoelectric properties cannot be achieved.

In formula (5), m representing the amount of strontium (Sr) and zirconium (Zr) is 0.04 or more and 0.07 or less. The m is preferably 0.04 or more and 0.06 or less so that deterioration of piezoelectric properties caused by the temperature variation will be inhibited. If m is higher than 0.07, it is hard to sinter the composition. When m is less than 0.04, high piezoelectric properties cannot be achieved.

In formula (5), n representing the amount of barium (Ba), niobium (Nb) and tantalum (Ta) is larger than 0 and 0.010 or less. The n preferably ranges from 0.001 to 0.008 and more preferably ranges from 0.003 to 0.007 so as to provide a piezoelectric composition with even better piezoelectric properties. When n is equal to 0 or higher than 0.010, high piezoelectric properties cannot be achieved.

In formula (5), p representing the amount of bismuth (Bi), sodium (Na) or potassium (K), and titanium (Ti) is 0.001 or more and 0.020 or less. The p preferably ranges from 0.005 to 0.020 and more preferably ranges from 0.005 to 0.015 to provide a piezoelectric composition with high piezoelectric properties and small variations caused by temperature. When p is equal to 0, the variation of piezoelectric properties against temperature becomes larger. In addition, if p is higher than 0.020, the curie temperature decreases and high piezoelectric properties cannot be achieved.

Further, it is preferable that at least one of manganese (Mn) and copper (Cu) is contained as the minor component and the piezoelectric composition represented by the following formula (6) will be provided when the minor component is calculated in terms of manganese oxide (MnO) or copper oxide (CuO) respectively. In this respect, the resistivity of the piezoelectric composition can be increased and a polarization treatment can be performed with applying an electric field of a higher intensity so that better piezoelectric properties can be provided.

$$(1-s)E+sF \quad (6)$$

(Wherein, in the formula, E represents the composite oxide represented by the formula (5) which is the main component, F represents the minor component, and $0<s\leq0.015$.)

At the boundaries among crystal grains of the composite oxides which are the main components, there is a microstructure in which at least one element of manganese (Mn) and copper (Cu) segregates. Thereby the resistivity of the piezoelectric composition can be increased so as to provide a stable piezoelectric composition with few deviations.

The piezoelectric composition mentioned above can be, for example, prepared in the following manner.

First of all, the powders of compounds containing sodium (Na), potassium (K), lithium (Li), niobium (Nb), tantalum (Ta), strontium (Sr), zirconium (Zr), barium (Ba), bismuth (Bi), titanium (Ti) and manganese (Mn) are respectively prepared as the starting materials of the main component and minor component in the piezoelectric composition. In addition, as the compound used as the starting material, the oxide or composite oxide of each element or a compound such as the carbonate or the oxalate that will convert into the oxide via heating can be used. Then, the staring materials are weighed to make the final composition fall within the ranges mentioned above after they are sufficiently dried.

Then, these materials are mixed in an organic solvent or water by using a ball mill or a bead mill.

Thereafter, the mixture is dried and subjected to a press molding or filled in a heat-resistant container such as a container made of ceramic to be calcined for 1 to 8 hours at 700° C. to 1100° C. The calcination process can be done for once. Alternatively, after the obtained calcined substance is pulverized, it is subjected to the press molding again or filled in a heat-resistant container to be repeatedly calcined.

After the calcination process, the calcined substance is, for instance, pulverized in an organic solvent or water by using a ball mill or a bead mill and is then dried to provide the powder of the material for piezoelectric composition. The piezoelectric composition according to one embodiment of the present invention can be obtained by sintering the powder of the material for the piezoelectric composition.

For instance, a binder is added to the powder of the material for piezoelectric composition to perform a granulation process. The granulated powder is then press molded by using a uniaxial press molding machine or a cold isostatic pressing machine (CIP). After the molding process, the molded body is heated to remove the binder. Thereafter, it is further fired at 950° C. to 1350° C. for 2 to 8 hours so as to provide the piezoelectric composition.

In addition, the piezoelectric composition may contain Pb. However, the amount of Pb is preferably 1 mol % or less, and it is more preferable that no Pb is contained. This is because the volatilization of Pb during the firing process or discharge of Pb into the environment after it is distributed in the market as a piezoelectric component and then abandoned can be inhibited to be a minimum. Thus, the amount of Pb is preferred to be as low as possible from the viewpoint of low pollution, environment and ecology. This piezoelectric composition is preferred used as the material for a vibrating element such as an actuator, a sounder or a sensor which are all piezoelectric elements. Also, such a piezoelectric composition is applicable to a sputtering target or a piezoelectric film element using the sputtering target.

FIG. 1 shows a structure example of the piezoelectric element which uses the piezoelectric composition of the present embodiment. The piezoelectric element is provided with a piezoelectric substrate 1 composed of the piezoelectric composition of the present embodiment, and a pair of electrodes 2 and 3 respectively disposed on a pair of opposite surfaces 1a and 1b of the piezoelectric substrate. The piezoelectric substrate is polarized in, for example, the thickness direction (i.e., the direction in which the electrodes 2 and 3 face to each other), and the piezoelectric substrate is subjected to the longitudinal vibration in the thickness direction and the extensional vibration in the radial direction when a voltage is applied through the electrodes 2 and 3.

The electrodes 2 and 3 are respectively composed of a metal such as silver (Ag), gold (Au) or the like. These electrodes 2 and 3 are electrically connected to external powder supplies via wires or the like (not shown).

Such a piezoelectric element can be prepared by, for example, processing the piezoelectric composition in the present embodiment if needed to form the piezoelectric substrate 1, disposing electrodes 2 and 3 and then providing a polarization treatment in the heated silicone oil under an applied electric field.

The preferable embodiment of the present invention has been described above but the present invention is not limited to the preceding embodiment. For instance, in the mentioned embodiment, the solid reaction method is used as the method for preparing the powder of the material for piezoelectric composition. However, the piezoelectric element can be prepared by using a hydrothermal synthesis method or a vapor deposition method.

EXAMPLES

Hereinafter, the present invention will be described in detail based on Examples and Comparative Examples. However, the present invention is not limited to the following examples.

Examples 1 to 5, 26 and 27 and Comparative Examples 1 to 2

First of all, the powders of sodium carbonate ($Na_2CO_3$), potassium carbonate ($K_2CO_3$), lithium carbonate ($Li_2CO_3$), niobium oxide ($Nb_2O_5$), tantalum oxide ($Ta_2O_5$), barium carbonate ($BaCO_3$), zirconium oxide ($ZrO_2$), strontium carbonate ($SrCO_3$), bismuth oxide ($Bi_2O_3$), titanium oxide ($TiO_2$), and manganese carbonate ($MnCO_3$) or copper oxide (CuO) were prepared as the main component and the minor component. These materials were sufficiently dried and then weighed in a manner of changing the composition of the piezoelectric compositions in Examples 1 to 5, 26 and 27 and Comparative Examples 1 to 2, i.e., changing the value of p.

The starting materials were mixed in ethanol by using a ball mill and then sufficiently dried in a thermostatic bath at 80 to 120° C. Then, the mixture was press molded and calcined at 750 to 1050° C. for 1 to 4 hours. The calcined article was pulverized in ethanol by using a ball mill and then dried again to prepare the powder of the material for piezoelectric composition.

Then, a binder (acrylic resin) was added to the powder of material for piezoelectric composition to perform a granulation process. The granulated powder was molded by using a uniaxial press molding machine at a pressure of about 25 MPa into disk-like pellets with a diameter of 17 mm.

After the molding process, the molded body was heater at 550° C. for 3 hours to remove the binder and then further fired at 1050 to 1200° C. for 2 hours. Thereafter, the fired body was processed to have a disk-like shape with a thickness of 0.6 mm so as to prepare the piezoelectric substrate 1. Silver (Ag) was used to form electrodes 2 and 3 on both surfaces through vacuum deposition. Then, the resultant is polarized in a silicone oil of 150° C. for 10 to 30 minutes by applying an electric field of 5 MV/m. In this way, the piezoelectric element was obtained.

After the obtained piezoelectric element was kept alone for 24 hours, the relative dielectric constant ($\in_r$) of 20° C. and the electro-mechanical coupling factor ($k_r$) were measured. In the measurement of $\in_r$ and $k_r$, an impedance analyzer 4294A (produced by Agilent Technologies Ltd.) was used, and the resonance method as well as the anti-resonance method was used. The frequency was 1 kHz in the measurement of $\in_r$. It had been known that the piezoelectric strain constant (constant d) representing the displacement amount of a piezoelectric element was in proportion to $\in_r^{1/2} \times k_r$, and thus $\in_r^{1/2} \times k_r$ was assessed as the piezoelectric properties. Further, with respect to the variation of piezoelectric properties caused by temperature change, the variation rate of $\in_r^{1/2} \times k_r$ at the temperature range of −40° C. to 85° C. was assessed based on JISC60068-2-1 and JISC6008-2-2 with 20° C. being the reference.

(Assessment Results)

The composition of the piezoelectric composition, the relative dielectric constant at 20° C. ($\in_r$), the electro-mechanical coupling factor ($k_r$), $\in_r^{1/2} \times k_r$ and the maximal absolute value of the variation rate of $\in_r^{1/2} \times k_r$ at the temperature range of −40° C. to 85° C. with 20° C. being the reference were listed in Table 1 for each Example and Comparative Example. The piezoelectric properties were preferred to be high. Thus, a value of $\in_r^{1/2} \times k_r$ was preferred to be 12 or more and a symbol "○" was marked to this preferable case. The case with a value less than 12 was assessed as not preferable and marked with a symbol "x". The variation rate against temperature was preferred to be small. Thus, the case with a maximal absolute value of the variation rate of $\in_r^{1/2} \times k_r$ against temperature being 10% or less was assessed as a more preferable one and was marked with a symbol "⊚" the case with the maximal absolute value being higher than 10% and 20% or less was assessed to be preferable and was marked with a symbol "○", and the case with the maximal absolute value being higher than 20% was assessed as not preferable and was marked with a symbol "x"

TABLE 1

| | x | y | z | w | m | n | q | p | D | s | F | $\varepsilon_r$ | $k_r$(%) | $\varepsilon_r^{1/2} \times k_r$ | Assessment on piezoelectric properties | Variation rate of $\varepsilon_r \times k_r$ against temperature (%) | Assessment on variation rate against temperature |
|---|---|---|---|---|---|---|---|---|---|---|---|---|---|---|---|---|---|
| Example 1 | 0.57 | 0.05 | 0.10 | 0.10 | 0.05 | 0.005 | 0.975 | 0.001 | (Bi0.5 Na0.5)TiO3 | 0.004 | MnO | 1754 | 47.2 | 19.8 | ○ | 17.7 | ○ |
| Example 2 | 0.57 | 0.05 | 0.10 | 0.10 | 0.05 | 0.005 | 0.975 | 0.005 | (Bi0.5 Na0.5)TiO3 | 0.004 | MnO | 1673 | 45.5 | 18.6 | ○ | 9.9 | ⊚ |
| Example 3 | 0.57 | 0.05 | 0.10 | 0.10 | 0.05 | 0.005 | 0.975 | 0.010 | (Bi0.5 Na0.5)TiO3 | 0.004 | MnO | 1534 | 42.0 | 16.5 | ○ | 9.1 | ⊚ |
| Example 4 | 0.57 | 0.05 | 0.10 | 0.10 | 0.05 | 0.005 | 0.975 | 0.015 | (Bi0.5 Na0.5)TiO3 | 0.004 | MnO | 1452 | 39.1 | 14.9 | ○ | 7.5 | ⊚ |
| Example 5 | 0.57 | 0.05 | 0.10 | 0.10 | 0.05 | 0.005 | 0.975 | 0.020 | (Bi0.5 Na0.5)TiO3 | 0.004 | MnO | 1432 | 35.7 | 13.5 | ○ | 5.3 | ⊚ |
| Example 6 | 0.20 | 0.05 | 0.10 | 0.10 | 0.05 | 0.005 | 0.975 | 0.010 | (Bi0.5 Na0.5)TiO3 | 0.004 | MnO | 1206 | 37.2 | 12.9 | ○ | 7.8 | ⊚ |
| Example 7 | 0.40 | 0.05 | 0.10 | 0.10 | 0.05 | 0.005 | 0.975 | 0.010 | (Bi0.5 Na0.5)TiO3 | 0.004 | MnO | 1307 | 40.6 | 14.7 | ○ | 8.4 | ⊚ |
| Example 8 | 0.70 | 0.05 | 0.10 | 0.10 | 0.05 | 0.005 | 0.975 | 0.010 | (Bi0.5 Na0.5)TiO3 | 0.004 | MnO | 1593 | 40.4 | 16.1 | ○ | 9.9 | ⊚ |
| Example 9 | 0.80 | 0.05 | 0.10 | 0.10 | 0.05 | 0.005 | 0.975 | 0.010 | (Bi0.5 Na0.5)TiO3 | 0.004 | MnO | 1648 | 39.2 | 15.9 | ○ | 13.6 | ○ |
| Example 10 | 0.57 | 0.02 | 0.10 | 0.10 | 0.05 | 0.005 | 0.975 | 0.010 | (Bi0.5 Na0.5)TiO3 | 0.004 | MnO | 1011 | 40.1 | 12.8 | ○ | 9.0 | ⊚ |
| Example 11 | 0.57 | 0.10 | 0.10 | 0.10 | 0.05 | 0.005 | 0.975 | 0.010 | (Bi0.5 Na0.5)TiO3 | 0.004 | MnO | 2164 | 31.0 | 14.4 | ○ | 9.2 | ⊚ |
| Example 12 | 0.57 | 0.10 | 0.01 | 0.01 | 0.05 | 0.005 | 0.975 | 0.010 | (Bi0.5 Na0.5)TiO3 | 0.004 | MnO | 946 | 39.5 | 12.1 | ○ | 14.1 | ○ |
| Example 13 | 0.57 | 0.05 | 0.05 | 0.05 | 0.05 | 0.005 | 0.975 | 0.010 | (Bi0.5 Na0.5)TiO3 | 0.004 | MnO | 1401 | 42.6 | 15.9 | ○ | 11.5 | ○ |
| Example 14 | 0.57 | 0.05 | 0.30 | 0.30 | 0.05 | 0.005 | 0.975 | 0.010 | (Bi0.5 Na0.5)TiO3 | 0.004 | MnO | 1553 | 36.6 | 14.4 | ○ | 7.2 | ⊚ |
| Example 15 | 0.57 | 0.05 | 0.10 | 0.10 | 0.04 | 0.005 | 0.975 | 0.010 | (Bi0.5 Na0.5)TiO3 | 0.004 | MnO | 1324 | 38.4 | 14.0 | ○ | 9.9 | ⊚ |
| Example 16 | 0.57 | 0.05 | 0.10 | 0.10 | 0.07 | 0.005 | 0.975 | 0.010 | (Bi0.5 Na0.5)TiO3 | 0.004 | MnO | 1540 | 38.3 | 15.0 | ○ | 10.9 | ○ |
| Example 17 | 0.57 | 0.05 | 0.10 | 0.10 | 0.05 | 0.001 | 0.975 | 0.010 | (Bi0.5 Na0.5)TiO3 | 0.004 | MnO | 1379 | 40.6 | 15.1 | ○ | 9.1 | ⊚ |
| Example 18 | 0.57 | 0.05 | 0.10 | 0.10 | 0.05 | 0.010 | 0.975 | 0.010 | (Bi0.5 Na0.5)TiO3 | 0.004 | MnO | 1435 | 39.5 | 15.0 | ○ | 9.1 | ⊚ |
| Example 19 | 0.57 | 0.05 | 0.10 | 0.10 | 0.05 | 0.005 | 0.800 | 0.010 | (Bi0.5 Na0.5)TiO3 | 0.004 | MnO | 1455 | 36.4 | 13.9 | ○ | 0.8 | ⊚ |
| Example 20 | 0.57 | 0.05 | 0.10 | 0.10 | 0.05 | 0.005 | 0.950 | 0.010 | (Bi0.5 Na0.5)TiO3 | 0.004 | MnO | 1582 | 40.3 | 16.0 | ○ | 8.2 | ⊚ |

TABLE 1-continued

| | x | y | z | w | m | n | q | p | D | s | F | $\varepsilon_r$ | $k_r$(%) | $\varepsilon_r^{1/2} \times k_r$ | Assessment on piezoelectric properties | Variation rate of $\varepsilon_r \times k_r$ against temperature (%) | Assessment on variation rate against temperature |
|---|---|---|---|---|---|---|---|---|---|---|---|---|---|---|---|---|---|
| Example 21 | 0.57 | 0.05 | 0.10 | 0.10 | 0.05 | 0.005 | 1.000 | 0.010 | (Bi0.5 Na0.5)TiO3 | 0.004 | MnO | 1409 | 39.9 | 15.0 | ○ | 11.6 | ○ |
| Example 22 | 0.57 | 0.05 | 0.10 | 0.10 | 0.05 | 0.005 | 1.050 | 0.010 | (Bi0.5 Na0.5)TiO3 | 0.004 | MnO | 1348 | 35.7 | 13.1 | ○ | 14.9 | ○ |
| Example 23 | 0.57 | 0.05 | 0.10 | 0.10 | 0.05 | 0.005 | 0.975 | 0.010 | (Bi0.5 Na0.5)TiO3 | 0.000 | — | 1494 | 40.1 | 15.5 | ○ | 9.1 | ○ |
| Example 24 | 0.57 | 0.05 | 0.10 | 0.10 | 0.05 | 0.005 | 0.975 | 0.010 | (Bi0.5 Na0.5)TiO3 | 0.015 | MnO | 1542 | 39.1 | 15.4 | ○ | 9.2 | ○ |
| Example 25 | 0.57 | 0.05 | 0.10 | 0.10 | 0.05 | 0.005 | 0.975 | 0.010 | (Bi0.5 Na0.5)TiO3 | 0.004 | CuO | 1453 | 41.3 | 15.7 | ○ | 9.1 | ○ |
| Example 26 | 0.57 | 0.05 | 0.10 | 0.10 | 0.05 | 0.005 | 0.975 | 0.010 | (Bi0.5 Na0.5)TiO3 | 0.004 | MnO | 1479 | 38.8 | 14.9 | ○ | 8.9 | ○ |
| Example 27 | 0.57 | 0.05 | 0.10 | 0.10 | 0.05 | 0.005 | 0.975 | 0.010 | (Bi0.5 Na0.25 K02.5)TiO3 | 0.004 | MnO | 1505 | 40.4 | 15.7 | ○ | 9.0 | ○ |
| Comparative Example 1 | 0.57 | 0.05 | 0.10 | 0.10 | 0.05 | 0.005 | 0.975 | 0.000 | — | 0.004 | MnO | 1788 | 48.0 | 20.3 | ○ | 30.2 | × |
| Comparative Example 2 | 0.57 | 0.05 | 0.10 | 0.10 | 0.05 | 0.005 | 0.975 | 0.030 | (Bi0.5 Na0.5)TiO3 | 0.004 | MnO | 1202 | 28.7 | 10.0 | × | 2.9 | ○ |
| Comparative Example 3 | 0.15 | 0.05 | 0.10 | 0.10 | 0.05 | 0.005 | 0.975 | 0.010 | (Bi0.5 Na0.5)TiO3 | 0.004 | MnO | 797 | 29.8 | 8.4 | × | 7.3 | ○ |
| Comparative Example 4 | 0.85 | 0.05 | 0.10 | 0.10 | 0.05 | 0.005 | 0.975 | 0.010 | (Bi0.5 Na0.5)TiO3 | 0.004 | MnO | 1034 | 26.1 | 8.4 | × | 15.8 | ○ |
| Comparative Example 5 | 0.57 | 0.01 | 0.10 | 0.10 | 0.05 | 0.005 | 0.975 | 0.010 | (Bi0.5 Na0.5)TiO3 | 0.004 | MnO | 451 | 34.9 | 7.4 | × | 9.0 | ○ |
| Comparative Example 6 | 0.57 | 0.20 | 0.10 | 0.10 | 0.05 | 0.005 | 0.975 | 0.010 | (Bi0.5 Na0.5)TiO3 | 0.004 | MnO | Cannot be polarized to low IR | | | × | — | × |
| Comparative Example 7 | 0.57 | 0.05 | 0.10 | 0.10 | 0.05 | 0.005 | 0.975 | 0.010 | (Bi0.5 Na0.5)TiO3 | 0.004 | MnO | 758 | 36.8 | 10.1 | × | 15.5 | ○ |
| Comparative Example 8 | 0.57 | 0.05 | 0.40 | 0.40 | 0.05 | 0.005 | 0.975 | 0.010 | (Bi0.5 Na0.5)TiO3 | 0.004 | MnO | 1412 | 22.4 | 8.4 | × | 4.8 | ○ |
| Comparative Example 9 | 0.57 | 0.05 | 0.10 | 0.10 | 0.02 | 0.005 | 0.975 | 0.010 | (Bi0.5 Na0.5)TiO3 | 0.004 | MnO | 923 | 34.3 | 10.4 | × | 14.4 | ○ |
| Comparative Example 10 | 0.57 | 0.05 | 0.10 | 0.10 | 0.10 | 0.005 | 0.975 | 0.010 | (Bi0.5 Na0.5)TiO3 | 0.004 | MnO | 1223 | 25.0 | 8.7 | × | 16.8 | ○ |

TABLE 1-continued

| | x | y | z | w | m | n | q | p | D | s | F | $\varepsilon_r$ | $k_r$(%) | $\varepsilon_r^{1/2} \times k_r$ | Assessment on piezoelectric properties | Variation rate of $\varepsilon_r \times k_r$ against temperature (%) | Assessment on variation rate against temperature |
|---|---|---|---|---|---|---|---|---|---|---|---|---|---|---|---|---|---|
| Comparative Example 11 | 0.57 | 0.05 | 0.10 | 0.10 | 0.05 | 0.000 | 0.975 | 0.010 | (Bi0.5Na0.5)TiO3 | 0.004 | MnO | 763 | 37.5 | 10.3 | x | 9.3 | ○ |
| Comparative Example 12 | 0.57 | 0.05 | 0.10 | 0.10 | 0.05 | 0.020 | 0.975 | 0.010 | (Bi0.5Na0.5)TiO3 | 0.004 | MnO | 985 | 36.4 | 11.4 | x | 8.9 | ○ |
| Comparative Example 13 | 0.57 | 0.05 | 0.10 | 0.10 | 0.05 | 0.005 | 0.750 | 0.010 | (Bi0.5Na0.5)TiO3 | 0.004 | MnO | 1400 | 31.2 | 11.7 | x | 4.3 | ○ |
| Comparative Example 14 | 0.57 | 0.05 | 0.10 | 0.10 | 0.05 | 0.005 | 1.070 | 0.010 | (Bi0.5Na0.5)TiO3 | 0.004 | MnO | 1333 | 30.5 | 11.1 | x | 16.7 | ○ |
| Comparative Example 15 | 0.57 | 0.05 | 0.10 | 0.10 | 0.05 | 0.005 | 0.975 | 0.010 | (Bi0.5Na0.5)TiO3 | 0.020 | MnO | 1185 | 34.0 | 11.7 | x | 8.6 | ○ |

In the composition analysis, an ICP-AES (ICPS-8100CL, produced by SHIMADZU Corporation) and an X-ray fluorescence analyzer (ZSZ-100e, produced by Rigaku) were used. Lithium (Li) was analyzed by ICP-AES, and the other elements except Li were analyzed through the X-ray fluorescence analyzer.

With respect to Examples 1 to 5, 26 and 27 and Comparative Examples 1 to 2, the value of p, $\varepsilon_r$, $k_r$ and the variation rate of piezoelectric properties against temperature were shown in Table 1. It could be seen from Table 1 that the variation rate of piezoelectric properties against temperature was small in Examples 1 to 5, 26 and 27 where p representing the amount of bismuth (Bi), sodium (Na) and/or potassium (K), and titanium (Ti) was 0.001 or more and 0.020 or less compared to that in Comparative Example 1 where p was less than 0.001. In another respect, it could be known that in Comparative Example 2 where the value of p was higher than 0.020, the piezoelectric properties deteriorated.

Examples 6 to 22 and Comparative Examples 3 to 14

Samples of Examples 6 to 22 and Comparative Examples 3 to 14 were prepared by using the same method as that in Examples 1 to 5 except that each starting material was weighed to change the values of x, y, z, m, n and/or q. These samples were also assessed, and the results were shown in Table 1.

As shown in Table 1, when x representing the amount of sodium (Na) was 0.20 or more and 0.80 or less, y representing the amount of lithium (Li) was 0.02 or more and 0.10 or less, z and w both representing the amount of tantalum (Ta) were 0.01 or more and 0.30 or less, m representing the amount of strontium (Sr) and zirconium (Zr) was 0.04 or more and 0.07 or less, n representing the amount of barium (Ba), niobium (Nb) and tantalum (Ta) was 0.010 or less, and q representing the ratio of A site to B site in the perovskite-type oxide was 0.800 or more and 1.050 or less, the piezoelectric properties were known to be high, and the variation rate of piezoelectric properties against temperature was small at the temperature range of −40° C. to 85° C. However, in Comparative Examples 3 to 14 where the values went beyond the ranges, the variation rate of piezoelectric properties against temperature was large or the piezoelectric properties were bad.

Examples 23 to 25 and Comparative Example 15

In addition, samples of Examples 23 to 24 and Comparative Example 15 were prepared by using the same method as that in Examples 1 to 5 except that the amount of manganese oxide (MnO) which was an additive was changed. These samples were also assessed, and the results were shown in Table 1. Further, a sample was prepared in Example 25 by using the same method as that in Examples 1 to 4 except that copper oxide (CuO) was weighed and added instead of manganese oxide (MnO). This sample was also assessed, and the results were shown in Table 1.

As shown in Example 23, when no manganese oxide (MnO) or copper oxide (CuO) was added, the piezoelectric properties were excellent and the variation brought by temperature was small at temperature range in use if the composition except manganese oxide (MnO) or copper oxide (CuO) fell within the specified ranges. In addition, as shown in Example 24, even if s representing the amount of added manganese oxide (MnO) was 0.015, the piezoelectric properties were good and the variation brought by temperature was small at temperature range in use. However, as shown in Comparative Example 15, if s representing the amount of added manganese oxide (MnO) was higher than 0.015, i.e., s was equal to 0.020, the piezoelectric properties deteriorated. Further, as shown in Example 25, even if copper oxide (CuO) was added instead of manganese oxide (MnO), the same effect was provided as that with manganese oxide (MnO).

It can be seen from Table 1 that if the values were within the composition ranges as described in claims, the piezoelectric properties were good and the variation rate of piezoelectric properties against temperature was small at the temperature range of −40° C. to 85° C. On the other hand, if the composition went beyond the composition range described in claims, the variation rate of piezoelectric properties against temperature was large or the piezoelectric properties were bad.

The embodiment and examples have been provided to describe the present invention. However, the present invention is not limited to these embodiment and examples and can be modified in many ways.

Further, in the embodiment mentioned above, the piezoelectric element with a single plate structure has been taken as an example in the description. However, the piezoelectric element with other structures such as a stacked structure is also applicable to the present invention. In addition, although a sounder, a sensor, and a vibrating element such as an actuator have been provided as the example of the piezoelectric element, other piezoelectric elements can also be used in the present invention. Further, the piezoelectric composition can be utilized in a sputtering target or a piezoelectric element prepared by using such a sputtering target.

The piezoelectric composition of the present invention can be used in a piezoelectric element such as a sounder, a sensor, and a vibrating element such as an actuator.

DESCRIPTION OF REFERENCE NUMERALS 1 piezoelectric substrate
1a, 1b opposite surface
2, 3 electrode

What is claimed is:

1. A piezoelectric composition comprising a composition represented by formula (5) as the main component,
wherein, the composition represented by formula (5) comprises a first perovskite-type oxide represented by the following formula (1), a second perovskite-type oxide represented by the following formula (2), a tungsten bronze-type oxide represented by the following formula (3) and a third perovskite-type oxide represented by the following formula (4), $$(K_{1-x-y}Na_xLi_y)_q(Nb_{1-z}Ta_z)O_3 \qquad (1)$$

$$SrZrO_3 \qquad (2)$$

$$Ba(Nb_{1-w}Ta_w)_2O_6 \qquad (3)$$

$$(Bi_{0.5}Na_{0.5})TiO_3 \text{ and/or } (Bi_{0.5}K_{0.5})TiO_3 \qquad (4)$$

$$(1-m-n-p)A+mB+nC+pD \qquad (5)$$

wherein, in formula (1), $0.20 \leq x \leq 0.80$, $0.02 \leq y \leq 0.10$, $0.01 \leq z \leq 0.30$ and $0.800 \leq q \leq 1.050$,
in formula (3), $0.01 \leq w \leq 0.30$,
in formula (5), A represents the composite oxide represented by the formula (1), B represents the composite oxide represented by the formula (2), C represents the composite oxide represented by the formula (3), D represents the composite oxide represented by the formula (4), and $0.04 \leq m \leq 0.07$, $0 < n \leq 0.010$ and $0.001 \leq p \leq 0.020$.

2. The piezoelectric composition of claim 1, wherein, the piezoelectric composition further comprises at least one of manganese (Mn) and copper (Cu) as the minor component, and the piezoelectric composition is represented by the following formula (6) when the minor component is calculated in terms of manganese oxide (MnO) or copper oxide (CuO) respectively, $$(1-s)E+sF \qquad (6)$$

in formula (6), E represents the composite oxide represented by the formula (5) which is the main component, F represents the minor component, and $0 < s \leq 0.015$).

3. A piezoelectric element comprising a piezoelectric substrate and external electrodes formed on the surfaces of the piezoelectric substrate, wherein,
the piezoelectric substrate is formed by the piezoelectric composition of claim 1.

4. A sputtering target formed by the piezoelectric composition of claim 1.

5. A piezoelectric element comprising a piezoelectric substrate and external electrodes formed on the surfaces of the piezoelectric substrate, wherein,
the piezoelectric substrate is formed by the piezoelectric composition of claim 2.

6. A sputtering target formed by the piezoelectric composition of claim 2.

* * * * *